US011232654B2

(12) United States Patent
Stefan et al.

(10) Patent No.: US 11,232,654 B2
(45) Date of Patent: Jan. 25, 2022

(54) X-IN-THE-LOOP TESTS FOR SELF-DRIVING MOTOR VEHICLES

(71) Applicant: Ford Global Technologies, LLC, Dearborn, MI (US)

(72) Inventors: Frederic Stefan, Aachen (DE); Alain Marie Roger Chevalier, Henri-Chapelle (BE); Michael Marbaix, Haillot (BE); Evangelos Bitsanis, Aachen (DE); Turgay Isik Aslandere, Aachen (DE)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 231 days.

(21) Appl. No.: 16/389,149

(22) Filed: Apr. 19, 2019

(65) Prior Publication Data

US 2019/0325672 A1 Oct. 24, 2019

(30) Foreign Application Priority Data

Apr. 23, 2018 (DE) ......................... 102018206188.2

(51) Int. Cl.
*G07C 5/00* (2006.01)
*G07C 5/08* (2006.01)
*G06F 30/20* (2020.01)
*B60W 50/02* (2012.01)

(52) U.S. Cl.
CPC ........... *G07C 5/0808* (2013.01); *G06F 30/20* (2020.01); *G07C 5/0825* (2013.01); *B60W 50/0205* (2013.01)

(58) Field of Classification Search
CPC ............... G07C 5/0808; G07C 5/0825; B60W 50/0205
See application file for complete search history.

(56) References Cited

U.S. PATENT DOCUMENTS

| 7,447,616 B2 | 11/2008 | Wang et al. |
| 2006/0277010 A1 | 12/2006 | Schutte et al. |
| 2014/0149092 A1 | 5/2014 | Nadobny et al. |
| 2017/0132118 A1 | 5/2017 | Stefan et al. |
| 2017/0197148 A1 | 7/2017 | George et al. |
| 2020/0257835 A1* | 8/2020 | Mikelsons ............... G06F 30/20 |

FOREIGN PATENT DOCUMENTS

| CN | 104536856 A | * 4/2015 | ............. G06F 11/22 |
| CN | 104794258 A | 7/2015 | |
| DE | 102015207932 A1 | 11/2016 | |

OTHER PUBLICATIONS

Nibert, J.; "Model-Based System Design for MIL, SIL, and HIL"; May 2012; World Electric Vehicle Journal vol. 5 (Year: 2012).*
Bock, T.; "Validation of the Vehicle in the Loop (VIL); A milestone for the simulation of driver assistance systems," 2007 IEEE Intelligent Vehicles Symposium, Istanbul, Aug. 2007, pp. 612-617 (Year: 2007).*

(Continued)

*Primary Examiner* — Thomas G Black
*Assistant Examiner* — Brittany Renee Peko
(74) *Attorney, Agent, or Firm* — Brandon Hicks; Bejin Bieneman PLC

(57) ABSTRACT

A computer includes a processor and a memory, the memory including instructions executable by the processor to identify a diagnostic test to perform for a vehicle component, identify one of a plurality of XiL platforms on which to perform the diagnostic test, and perform the diagnostic test on the identified XiL platforms.

18 Claims, 6 Drawing Sheets

(56) References Cited

OTHER PUBLICATIONS

Schreiber, V.; "Shared and Distributed X-in-the-Loop Tests for Automotive Systems: Feasibility Study" Oct. 2017 (Year: 2017).*
Tibba, G. "Testing Automotive Embedded Systems under X-in-the-Loop Setups." Nov. 7, 2016. ICCAD. (Year: 2016).*
Albers et al., "Implementation of a Vehicle-In-The-Loop Development and Validation Platform", F2010-C-177, https://pdfs.semanticscholar.org/4af6/ac4e8713a381983363bd4f7d37613e52fcb3.pdf.
Jiri, "Software testing for embedded applications in autonomous vehicles" Master Thesis, Czech Technical University in Prague, https://support.dce.felk.cvut.cz/mediawiki/images/f/fd/Dp_2017_kerner_jiri.pdf.
Swanson et al., "Extending driving simulator capabilities toward Hardware-in-the-Loop testbeds and remote vehicle interfaces", Conference: Intelligent Vehicles Symposium Workshops (IV Workshops), 2013 IEEE, DOI: 10.1109/IVWorkshops.2013.6615236.
Tibba et al., "Testing automotive embedded systems under X-in-the-loop setups", Conference: the 35th International Conference, DOI: 10.1145/2966986.2980076, https://www.researchgate.net/publication/309274044_Testing_automotive_embedded_systems_under_X-in-the-loop_setups.
Gechter et al., "Virtual intelligent vehicle urban simulator: Application to vehicle platoon evaluation", https://doi.org/10.1016/j.simpat.2012.02.001, Simulation Modelling Practice and Theory vol. 24, May 2012, pp. 103-114, https://www.sciencedirect.com/science/article/pii/S1569190X12000172.

* cited by examiner

X-IN-THE-LOOP TESTS FOR SELF-DRIVING MOTOR VEHICLES

CROSS-REFERENCE TO RELATED APPLICATION

This patent application claims priority to German Application No. DE 102018206188.2 filed on Apr. 23, 2018, which is hereby incorporated by reference in its entirety.

BACKGROUND

The present disclosure relates to a system for carrying out XiL tests of components of self-driving motor vehicles.

Self-driving motor vehicles (sometimes also referred to as autonomous land vehicles) are motor vehicles which can drive, steer, and park without the intervention of a human driver (highly automated driving or autonomous driving). If no manual control is necessary on the part of the driver, the term robot car is also used. The driver's seat may be unoccupied; it is possible that no steering wheel, brake pedal, and accelerator pedal are present.

Self-driving motor vehicles can detect their surroundings with the aid of various sensors and determine their position and that of other road users from the information obtained, drive toward a destination by communicating with the navigation software, and avoid collisions along the route.

The emergence of intelligent mobility solutions and automated driving functions entails new challenges when testing such systems. Physical prototyping and/or thorough actual test drives are extremely challenging. For this reason, new technologies for virtual engineering have been developed over the last several years.

One important requirement for testing such systems is the provision of X-in-the-loop frameworks, which enable testing the developed software on various platforms such as MiL (model-in-the-loop), SiL (software-in-the-loop), HiL (hardware-in the-loop), DiL (driver-in-the-loop), etc., with an actual ECU, on actual prototypes.

An ECU or embedded control unit is to be understood to mean an electronic module which is designed to control or manage other components such as components of a motor vehicle, for example, using a control or regulation strategy.

Typically, at least one ECU which comprises the software to be tested, and a model which emulates the behavior of the system, are used in the tests. The models and the ECUs can be tested in various combinations. For example, in MiL, the ECUs can run in Simulink and the model can run in Simulink or CarSim; in SiL, the ECUs can be compiled for a PC and the model can be compiled for a PC; in HiL, the ECUs can run on an actual ECU, and the model can run on a real-time machine (for example, dSPACE, Concurrent). During the project life cycle, the same control software must be tested by different teams at different locations and on different platforms. However, the test specifications cannot be used simultaneously, since different teams use different models having different names, and may use different platforms. In addition, with the emergence of automated driving functions, new, complex scenarios and application cases must be tested, which are not always supported by conventional testing tools.

Therefore, there is the need to demonstrate ways in which the carrying out of such tests can be simplified.

SUMMARY

The present disclosure includes a system for carrying out XiL tests of components of self-driving motor vehicles, comprising at least a platform interface module, wherein the platform interface module is designed to carry out tests on a plurality of XiL platforms.

In other words, the platform interface module makes it possible to carry out the same test (or the same simulation) on an SiL, MiL, HiL, or DiL platform, without redefining the test (or the simulation). Thus, various tests can be carried out on one platform, thereby simplifying the execution of such tests.

According to one embodiment, the plurality of the XiL platforms can comprise at least an SiL and/or MiL and/or HiL and/or DiL platform.

Thus, the XiL tests may be MiL (model-in-the-loop), SiL (software-in-the-loop), HiL (hardware-in the-loop) and/or DiL (driver-in-the-loop). MiL comprises the construction of models for a controlled system and an ECU, and control logic with a control strategy for behavior simulation; SiL comprises the creation of models in the target language of the ECU for automated testing during the software development; HiL refers to a method in which an embedded system (for example, an actual electronic ECU or actual mechatronic component, the hardware) is connected to a matched counterpart via its inputs and outputs; and DiL is to be understood to mean a combination of the HiL simulation with a driving simulator in a DiL simulation environment.

According to another embodiment, an SiL software agent and an HiL software agent can share the same software agent. A software agent is to be understood to mean a computer program which is capable of certain independent and inherently dynamic (autonomous) behavior. This means that, depending on various states (status), a particular processing operation runs without a start signal being provided externally, or without an external control intervention occurring during the operation. Thus, the number of required software agents may be reduced.

According to another embodiment, the platform interface module can comprise a programming interface for data exchange with other components of the system. In this case, an API (application programming interface) is to be understood to mean a program portion which is provided by a software system to other programs for connecting to the system. For example, here, a programming interface, for example, ASAM XiL API, may be used.

According to another embodiment, an immersion module can be provided which is designed to depict a visual rendition of at least one test to a user. In other words, the immersion module provides a virtual reality with which the user can interact. The immersion module may be a virtual reality platform on the spatial scale (for example, HTC Vive, Oculus, etc.), with which a test engineer or design engineer can carry out a test as a spectator or an actor using additional devices, for example, a head-mounted display and/or body tracking.

According to another embodiment, a driving simulator can be provided which is designed to carry out a simulation via a physical model of a motor vehicle and a control or regulation strategy. The driving simulator makes it possible to carry out a simulation with a physical model of a motor vehicle and a control or regulation strategy which runs in actual ECUs. In other words, using the driving simulator, the user can test a control or regulation strategy as the driver, in that said user uses more realistic interfaces (for example, steering wheels, pedals, gear shifts, etc.). The drive simulator may include force-feedback simulation and G-force simulation if the driving behavior is tested. The driving simulator may be connected directly to a game engine and may contain the information (for example, forces, velocities, etc.) which is necessary to implement the simulation from there. A game engine is to be understood to mean a particular framework for computer games which controls the game progression, and which is responsible for the visual depiction of the progress of the game. The most frequently used game engines include the CryEngine, Frostbite, the Unity Engine, and the Unreal Engine.

According to another embodiment, the system can be designed to determine which of the XiL platforms are required. In an additional step, communication with the relevant platform may be initialized. Thus, only the platforms are loaded which are actually needed, thereby saving computing resources.

According to another embodiment, the system can be designed to check whether the test is a real-time test, and to carry out a synchronization in response to a detection of a real-time test. It may thus be taken into account that the length of the simulation on the selected XiL platform is longer than the length of the simulation on a game engine. In addition, it may be provided to carry out a synchronization if the test is not a real-time test.

Furthermore, the present disclosure can comprise a computer program product for such a system.

DETAILED DESCRIPTION

Figure 1:
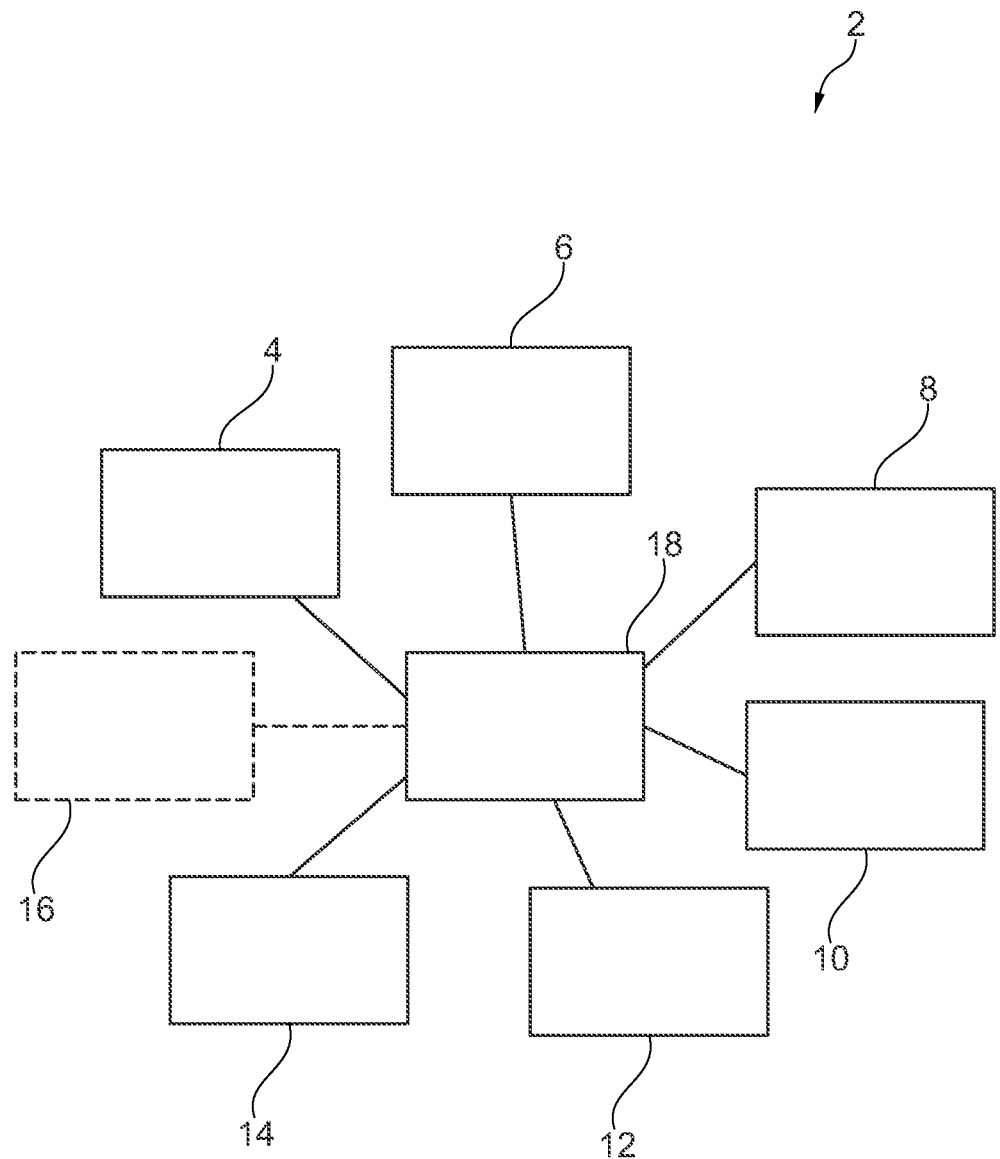
FIG. 1 shows a schematic representation of a system for carrying out XiL tests of components of self-driving motor vehicles.

As shown in FIG. 1, a system 2 is designed for carrying out XiL tests of components of self-driving motor vehicles.

In the present exemplary embodiment, the actual motor vehicle is a passenger car. Furthermore, in the present exemplary embodiment, the actual motor vehicle is designed as a self-driving motor vehicle, which can drive, steer, and park without the intervention of a human driver. For this purpose, the actual motor vehicle comprises various sensors (not depicted) for detecting the surroundings, and can determine its position and that of the other road users from the information obtained, drive toward a destination by communicating with the navigation software, and avoid collisions along the route.

The XiL tests may also be MiL (model-in-the-loop), SiL (software-in-the-loop), HiL (hardware-in-the-loop), and/or DiL (driver-in-the-loop).

MiL comprises the construction of models for a controlled system and an ECU, and control logic with a control strategy for behavior simulation; SiL comprises the creation of models in the target language of the ECU for automated testing during software development; HiL refers to a method in which an embedded system (for example, an actual electronic ECU or actual mechatronic component, i.e. hardware) is connected to a matched counterpart via its inputs and outputs; and DiL is to be understood to mean a combination of the HiL simulation with a driving simulator in a DiL simulation environment.

In the present disclosure, the system 2 comprises a 3D simulation module 4, an immersion module 6, a platform interface module 8, a model interface module 10, a data exchange module 12, a network 14, an XiL module 16, and a driving simulator 18.

The 3D simulation module 4 is an environment in which the users can specify virtual 3D test scenarios and carry out tests and simulations. A commercial tool (for example, PreScan, Oktal, CarSim) or a game engine may be used for this purpose.

In the present exemplary embodiment, the immersion module 6 is a virtual reality platform on the spatial scale (for example, HTC Vive, Oculus, etc.), via which a test engineer or a design engineer can carry out a test as a spectator or an actor using a head-mounted display and/or body tracking.

The platform interface module 8 makes it possible to carry out the same test (or the same simulation) on an SiL, MiL, HiL, or DiL platform, without redefining or changing the test (or the simulation). This can be achieved, for example, by defining and implementing a standard software interface (API such as the ASAM XiL API).

The model interface module 10 makes it possible to carry out the same test (or the same simulation) using various models, i.e., using models which were implemented according to different naming conventions, style guides, etc.

The data exchange module 12 is a module which carries out the entire data exchange, the data integrity, and the data synchronization between the various modules of the system 2 and in particular between the XiL platform on the one hand and the 3D simulations and visualization environment on the other hand.

The network 14 makes it possible to connect to a global communication network, so that other users can participate in the test or the simulation as spectators or actors, with or without immersion.

The XiL module 16 comprises, for example, several HiL rigs with real-time components (for example, dSPACE or Concurrent) for carrying out models, and/or ECUs for carrying out control or regulation strategies. On the other hand, the XiL module 16 may comprise various tools and methods for reading, writing, recording data (for example, Control Desk), or an automation tool in order to plan a collection of tests overnight.

The driving simulator 18 makes it possible to carry out a simulation with a physical model of a motor vehicle and a control or regulation strategy which runs in actual ECUs.

The aforementioned components may comprise hardware and/or software components for their tasks and functions which are described below.

Figure 2:
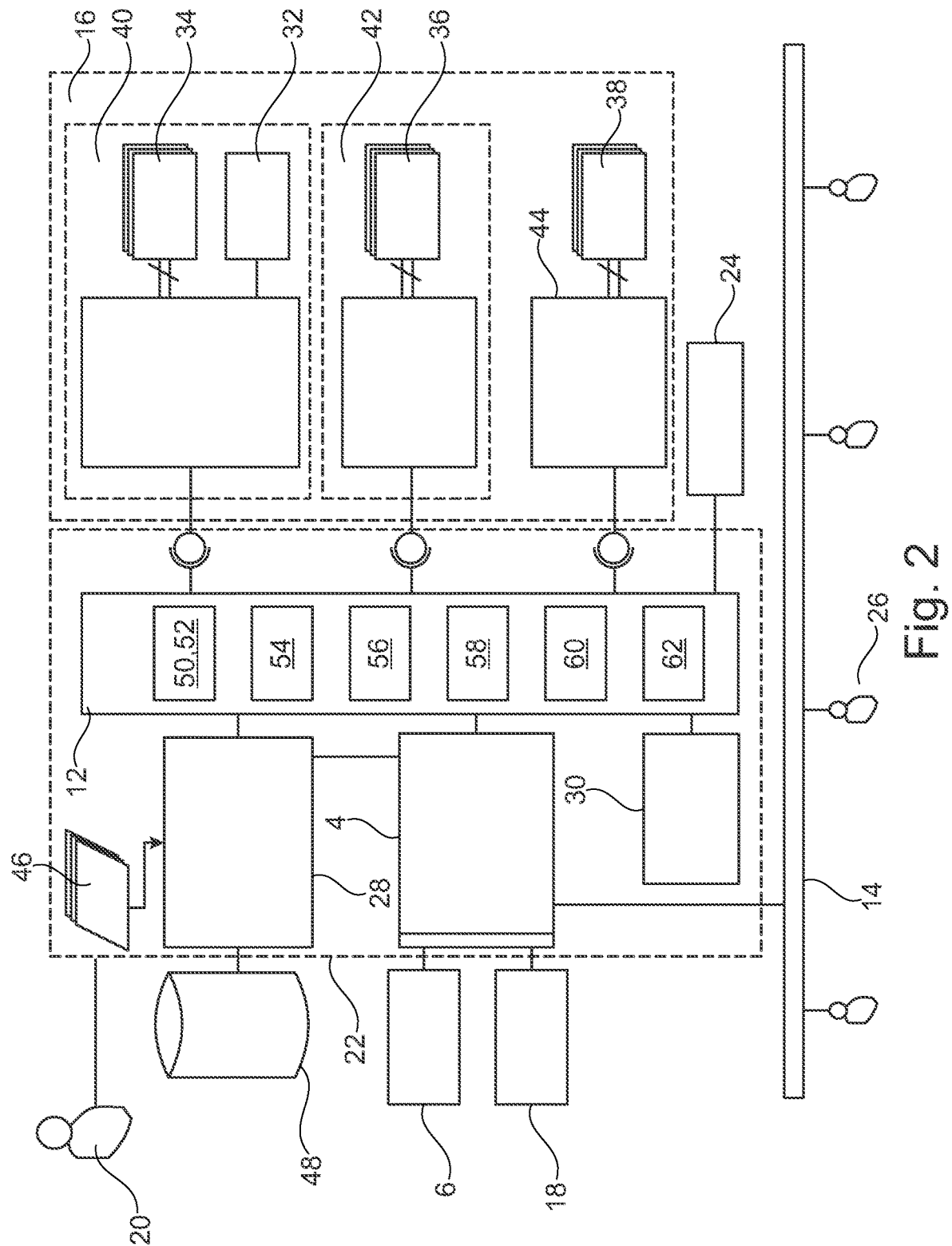
FIG. 2 shows a schematic representation of other details of the system depicted in FIG. 1.

As shown in FIG. 2, a user 20 is depicted, who would like to use the system 2 for a simulation or an XiL test.

The user 20 operates a terminal 22. The terminal 22 may, for example, be a PC, a smartphone, a tablet, or a notebook. In the present exemplary embodiment, the terminal 22 comprises at least the 3D simulation module 4 and the data exchange module 12, as well as a test automation framework 28 and a physics engine 30.

The simulation module 4 can be designed to provide definitions of 3D environments and scenarios in which tests or simulations take place. This environment contains at least one internal simple physics engine (not depicted), in order to simulate physical laws during a virtual 3D test. A VR plug-in enables the visual immersion into scenarios which were developed with a network plug-in for multiple users. A plug-in is to be understood to mean a software enhancement or an additional module in the form of an optional software component which enhances or modifies existing software. The simulation module 4 may contain a game engine or may be built on it. Furthermore, it may be provided to use the 3D environment in an implementation only for the purpose of depiction.

The data exchange module 12 can be responsible for the communication between the XiL platforms and the running tools. In the present exemplary embodiment, the data exchange module 12 comprises an SiL software agent 50, an HiL software agent 52, an MiL software agent 54, a DiL software agent 56, and an ECU software agent 58, as well as a synchronization software agent 60 for data exchange, and a communication software agent 62 for carrying out the communication with a signal processing platform 24.

The signal processing platform 24 can be designed to ascertain the platform of the test, based on the information provided by the test automation framework 28. On the basis thereof, the suitable communication software agent may be activated, i.e., an MiL, SiL, HiL or ECU manager. Each software agent may be based on different technologies.

The SiL software agent 50 and the HiL software agent 52 may share the same software agent (for example, XiL API model access port implementation) in order to handle communication with models.

The ECU software agent 58 may be a specific software agent which is specified for communication with different ECUs (for example, implementing the XiL-API-ECU access port).

The communication software agent 62 may be a specific software agent which is designed for communication with models in the game engine or the physics engine 30, for example, CarSim and Control Strategy in Matlab/Simulink, including its own signal processing (for example, Computer Vision Toolbox). This software agent could be implemented based on shared memory and UDP.

Each software agent ensures the data integrity in order to guarantee that only one actor is currently writing or reading data. Finally, the synchronization software agent 60 is called to ensure the synchronization of the communication (co-simulation). This depends on whether or not the test or the simulation must be carried out on the real-time platform. Here, real-time, or rather, in real time, is to be understood to mean a system provides a particular result reliably within a predetermined period of time.

If a real-time platform is in the loop, the 3D game engine may be too slow or too fast. In this case, it may be provided to force components, for example, a game engine, to wait or to work more slowly if it is too fast. If there is no real-time platform in the loop, a conventional synchronization strategy (for example, double-swing buffer) may be implemented, in which the model and/or control platforms exchange their respective simulation times and wait for one another before they pass to the next simulation step.

The test automation framework 28 is the core logic of the system 2 which makes it possible to configure, set up, plan, and execute tests and simulations on the XiL platform. It may contain several test specifications 46 and a model abstraction database 48 in order to be able to execute the same test with different modes. The operating modes of these modules will be explained below.

The physics engine 30 can be accessed if the user 20 has special requirements with respect to a physical model. The physics engine 30 may, for example, be CarSim.

In the present exemplary embodiment, the XiL module 16 comprises an SiL platform 32, an HiL platform 34, an ECU platform 36, an MiL platform 38, a model abstraction module 40, an ECU abstraction module 42, and an MiL abstraction module 44.

The SiL platform 32 is designed in such a way that the user 20 has compiled the model and its ECU for the terminal 22. Typically, an SiL platform may be a PC, a smartphone, a tablet, or a notebook. For each of these devices, the SiL software implements an API or access port code segment which allows platform abstraction (for example, according to the XiL API MAP port standard).

The HiL platform 34 is designed in such a way that the user 20 compiles the model for a real-time device (for example, dSPACE or Concurrent). For each real-time device family, the HiL software (which was compiled for the real-time device) implements an API or access port code segment which allows platform abstraction (for example, according to the XiL API MAP port standard).

The ECU platform 36 is part, for example, of an HiL test. The control or regulation strategy developed by the user 20, which is then to be implemented later in a motor vehicle, runs on said test. Tools such as INCA or ATI are used. Each software segment implements an API or access port code which allows platform abstraction (for example, according to the XiL API EAP port standard).

The MiL platform 38 is used if the user 20 develops a control or regulation strategy, for example, in Simulink, and tests it with a model that also runs in Simulink or in an external tool, for example, a game engine or CarSim. In the case of configuration as an external tool, an API or access port code segment is implemented which enables platform abstraction. This may take place by using a shared memory, UDP from the Simulink side, and an API from the tool side.

The model abstraction module 40 allows models to run on the SiL platform 32 and/or the HiL platform 34, i.e., the terminal 22 or another real-time device.

The ECU abstraction module 42 is designed in such a way that control or regulation strategies run on the ECU, so that an actual control or regulation strategy can be tested on a test bench before it is integrated into motor vehicles.

In the present exemplary embodiment, the MiL abstraction model 44 is based on a model-based development environment such as Simulink, and is designed to implement controllers as a model. It may be executed on an external tool such as CarSim, or on a game engine.

The immersion module 6 is designed to enable the user 20 to view the test or the simulation as a spectator or even as a participant. It includes immersion in the scene, a controller, a head-mounted display, a body tracking device, etc. Immersion platforms are typically integrated into a 3D simulation environment by means of a dedicated plug-in which is provided for these environments. The immersion may be carried out independently of the rest of the test. It is connected only to the 3D simulation environment.

In the present exemplary embodiment, the network 14 provides an Internet connection which makes it possible for other users 26 at a remote location to join the test or simulation structure via the user 20, in a manner similar to that of online computer games. The game engine provides a plug-in in order to enable networks which can be used for this purpose. These functions may be used to a collaborative test operation mode.

Via the driving simulator 18, the user 20 can test a control or regulation strategy as a driver, in that said user uses more realistic interfaces (steering wheels, pedals, gear shifts, etc.). The drive simulator may include force-feedback simulation and G-force simulation if the driving behavior is tested. The driving simulator 18 may be directly connected to a game engine and may contain the information (forces, velocities, etc.) which is necessary to implement the simulation from there.

Figure 3:
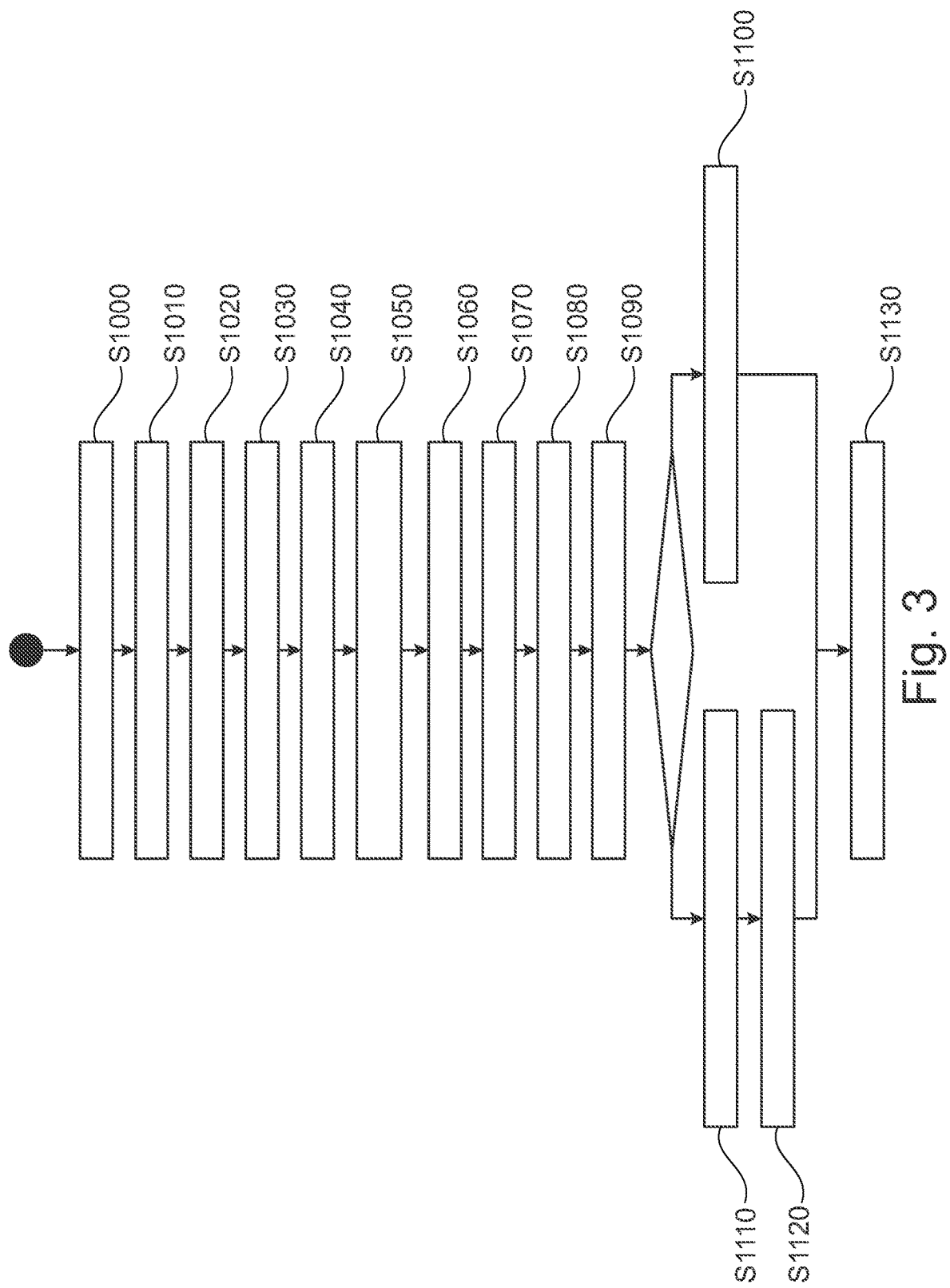
FIG. 3 shows a schematic representation of a method sequence during the operation of the system depicted in FIG. 1.

The execution of a setup test will now be described with additional reference to FIG. 3.

The user 20 first selects at least one model for at least one target model platform, and at least one control software program for at least one target control platform (steps S1000 to S1040). The user 20 then chooses a 3D environment and a scenario definition for the game engine (step S1050). Furthermore, the physics engine 30 is configured (step S1060).

Optionally, the user 20 may configure one or a plurality of signal processing algorithms, which are executed on one platform (step S1070). In addition, the user 20 may configure several visual immersion elements on the game engine and an interconnection (steps S1080 and S1090). Finally, the user 20 may select whether the test or the simulation is to be executed as X-in-the-loop.

In this case, the driving simulator 18 is configured by the user 20 (step S1100). Otherwise, several test definition and analysis files will be provided, which, for example, contain input stimuli and evaluation and report instructions (steps S1110 and S1120).

In an additional step, the software is then loaded and the system 2 is activated (step S1130).

Figure 4:
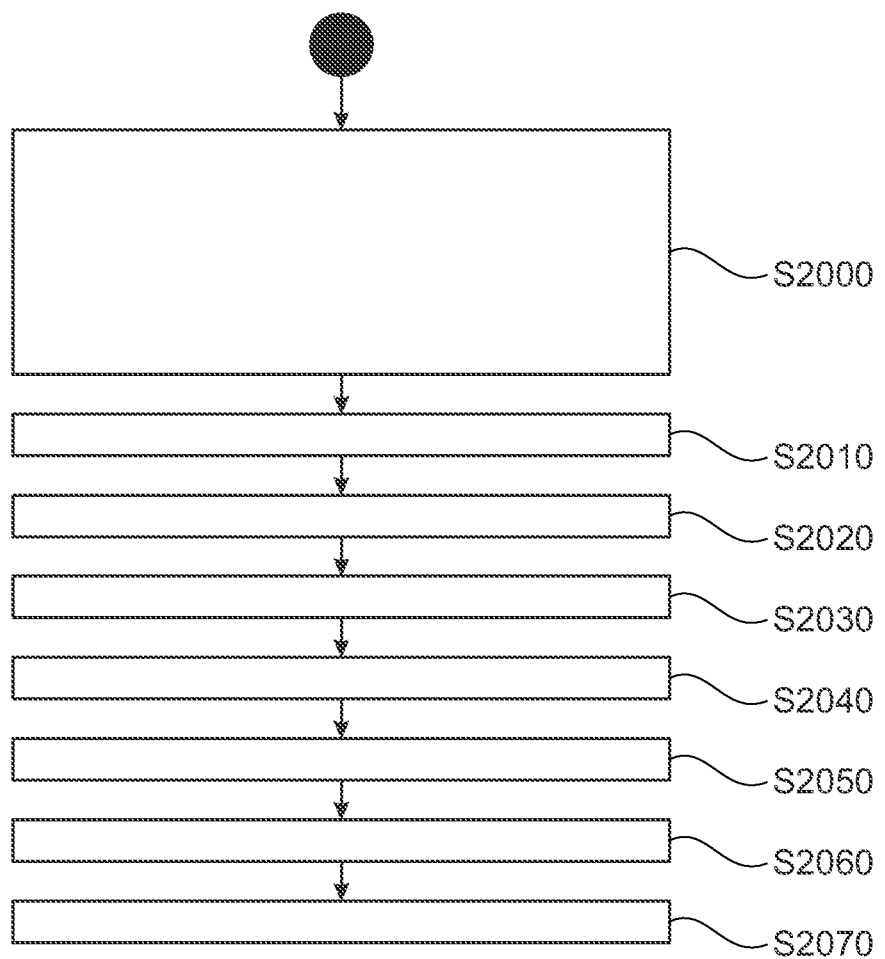
FIG. 4 shows a schematic representation of another method sequence during the operation of the system depicted in FIG. 1.

A running test will now be described with additional reference to FIG. 4.

In a first step, planning of the test takes place, along with a computing resource allocation. This may also comprise multi-threading (step S2000).

In an additional, optional step, a server may be started for operation in the network 14 (step S2010).

In an additional, optional step, the immersion module 6 may be started (step S2020).

In an additional, optional step, the driving simulator 18 may be started (step S2030).

In an additional step, the system 2 is now activated (step S2040).

In an additional step, the local connections are then checked (step S2050).

In an additional, optional step, signal processing may be started (step S2060).

Finally, in an additional step, the test or the simulation may be started (step S2070).

Figure 5:
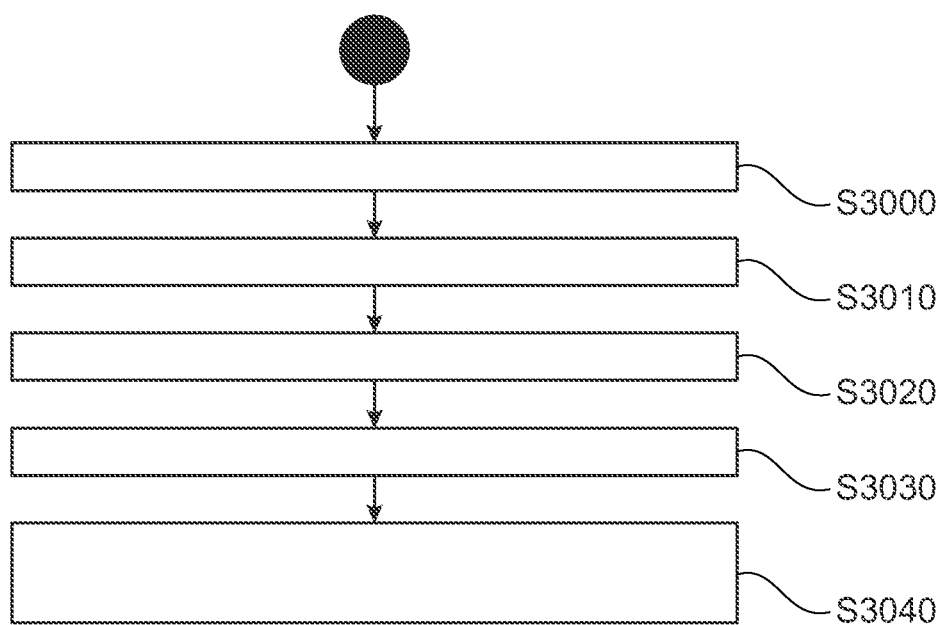
FIG. 5 shows a schematic representation of another method sequence during the operation of the system depicted in FIG. 1.

The operation of the model interface module 10 will now be described with additional reference to FIG. 5.

In a first step, a model is read in (step S3000).

In an additional step, access takes place to a signal-day database (step S3010).

In an additional step, an analysis of the model is carried out in order to extract signals, and their path is extracted, for example, as a Simulink path (step S3020).

In an additional step, a query takes place with respect to the name of the signal in the database (step S3030).

Finally, in an additional step, the label and the path are used in a file such as an XML file (step S3040). The labels or tags are logical names which are used in the test instructions or test specifications.

Figure 6:
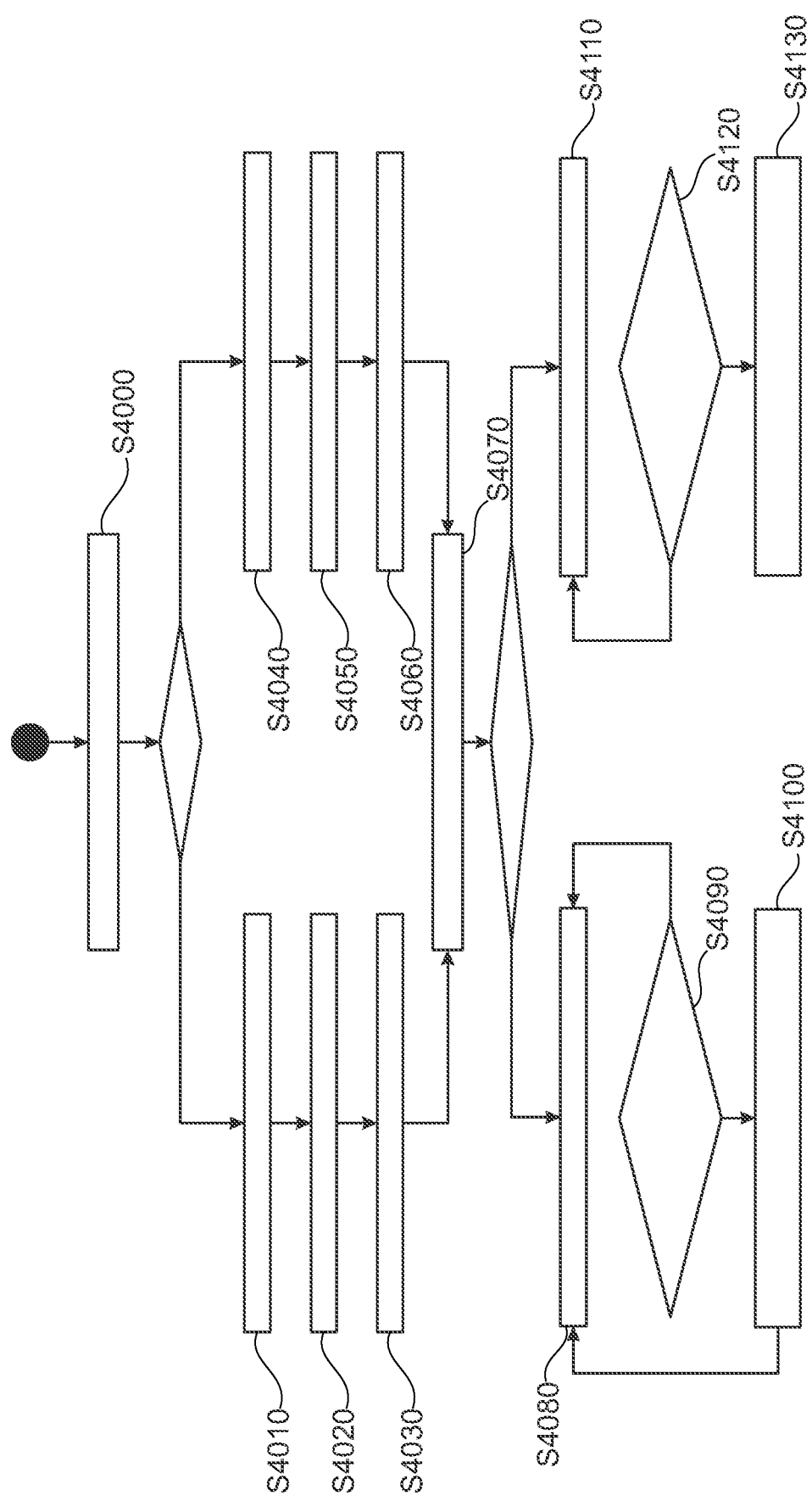
FIG. 6 shows a schematic representation of another method sequence during the operation of the system depicted in FIG. 1.

The operation of the system 2 will now be described with additional reference to FIG. 6.

In a first step, it is determined which of the XiL platforms are required (step S4000).

If the SiL platform 32, the HiL platform 34, or the ECU platform 36 is required, in an additional step, communication with the corresponding platform is initialized (step S4010).

In an additional step, the local connections are then checked (step S4020).

In an additional step, a data exchange is then started (step S4030).

On the other hand, if the MiL platform 38 or the signal processing platform 24 is required, in an additional step, communication with the corresponding platform is initialized (step S4040).

In an additional step, the local connections are then checked (step S4050).

In an additional step, a data exchange is then started (step S4060).

In both cases, in an additional step, it checked whether or not the test or the simulation is a real-time test or a real-time simulation (step S4070).

If the test or the simulation is a real-time test or a real-time simulation, in an additional step, a synchronization takes place (step S4080).

In an additional step, it is checked whether the length of the simulation on the selected XiL platform is longer than the length of the simulation of the game engine (step S4090).

If this is the case, a return is made to the previous step (step S4080) for synchronization.

Otherwise, in an additional step, a time factor of the game engine is reduced to zero, or the time factor of the simulation is adjusted (step S4100). The method is then continued with the synchronization (step S4080).

However, if the test or the simulation is not a real-time test or is not a real-time simulation, synchronization takes place in an additional step (step S4110).

In an additional step, it is checked whether the simulation step was completed by the game engine (step S4120).

If this is not the case, a return is made to the previous step (step S4110) for synchronization.

Otherwise, in an additional step, the simulation step is carried out, for example, in Simulink (step S4130).

Thus, via the system 2, various tests may be carried out on an XiL platform, thus simplifying the execution of such tests.

LIST OF REFERENCE CHARACTERS

2 System
3D simulation module
6 Immersion module
8 Platform interface module
10 Model interface module
12 Data exchange module
14 Network
16 XiL module
18 Driving simulator
20 User
22 Terminal
24 Signal processing platform
26 User
28 Test automation framework
30 Physics engine
32 SiL platform
34 HiL platform
36 ECU platform
38 MiL platform 40 Model abstraction module
42 ECU abstraction module
44 MiL abstraction module
46 Test specification files
48 Model abstraction database
50 SiL software agent
52 HiL software agent
54 MiL software agent
56 DiL software agent
58 ECU software agent
60 Synchronization software agent
62 Communication software agent

The invention claimed is:

1. A system, comprising a computer including a processor and a memory, the memory including instructions executable by the processor to:
- simulate a vehicle and an environment in which operation of the vehicle is simulated;
- identify a diagnostic test to perform for a specified vehicle component of the vehicle operating in the simulated environment, the diagnostic test including a control strategy or a regulation strategy of the specified vehicle component and executable on each of a plurality of X-in-the-loop (XiL) platforms, the plurality of XiL platforms including a software-in-the-loop (SiL) platform, a hardware-in-the-loop (HiL) platform, a model-in-the-loop (MiL) platform, and a driver-in-the-loop (DiL) platform;
- identify one of the plurality of XiL platforms on which to perform the diagnostic test;
- select from a plurality of software agents separate from the XiL platforms for communicating with the identified XiL platform based on the identified XiL platform, wherein a software agent for the SiL platform and the HiL platform is shared; and
- perform the diagnostic test for the specified vehicle component on the identified XiL platform.

2. The system of claim 1, further comprising a programming interface for data exchange.

3. The system of claim 2, wherein the instructions further include instructions to provide a visual rendition of at least one diagnostic test to a user.

4. The system of claim 3, wherein instructions further include instructions to, upon determining that the diagnostic test is a real-time test, to carry out a synchronization of data collected by the data exchange.

5. The system of claim 1, wherein the instructions further include instructions to provide a three-dimensional rendition of the diagnostic test to a virtual reality user platform.

6. The system of claim 5, wherein the instructions further include instructions to receive user input from the virtual reality user platform to perform the diagnostic test.

7. The system of claim 1, wherein the instructions further include instructions to synchronize simulation times of the diagnostic test performed in a simulator.

8. A method, comprising:
- simulating a vehicle and an environment in which operation of the vehicle is simulated;
- identifying a diagnostic test to perform for a specified vehicle component of the vehicle operating in the simulated environment, the diagnostic test including a control strategy or a regulation strategy of the specified vehicle component and executable on each of a plurality of X-in-the-loop (XiL) platforms, the plurality of XiL platforms including a software-in-the-loop (SiL) platform, a hardware-in-the-loop (HiL) platform, a model-in-the-loop (MiL) platform, and a driver-in-the-loop (DiL) platform;
- identifying one of the plurality of XiL platforms on which to perform the diagnostic test;
- selecting from a plurality of software agents separate from the XiL platforms for communicating with the identified XiL platform based on the identified XiL platform, wherein a software agent for the SiL platform and the HiL platform is shared; and
- performing the diagnostic test for the specified vehicle component on the identified XiL platform.

9. The method of claim 8, further comprising exchanging data on a programming interface for data exchange.

10. The method of claim 9, further comprising providing a visual rendition of at least one diagnostic test to a user.

11. The method of claim 10, further comprising, upon determining that the diagnostic test is a real-time test, carrying out a synchronization of data collected by the data exchange.

12. The method of claim 8, further comprising providing a three-dimensional rendition of the diagnostic test to a virtual reality user platform.

13. The method of claim 12, further comprising receiving user input from the virtual reality user platform to perform the diagnostic test.

14. The method of claim 8, further comprising synchronizing simulation times of the diagnostic test performed in a simulator.

15. The system of claim 1, wherein the software agent for the MiL platform is not shared.

16. The system of claim 1, wherein the software agent for the DiL platform is not shared.

17. The method of claim 8, wherein the software agent for the MiL platform is not shared.

18. The method of claim 8, wherein the software agent for the DiL platform is not shared.

* * * * *